(12) United States Patent
Cui et al.

(10) Patent No.: US 11,968,901 B2
(45) Date of Patent: Apr. 23, 2024

(54) DISPLAYING SUBSTRATE, MANUFACTURING METHOD THEREOF, AND DISPLAY PANEL

(71) Applicant: BOE Technology Group Co., Ltd., Beijing (CN)

(72) Inventors: Zhao Cui, Beijing (CN); Feng Zhang, Beijing (CN); Zhijun Lv, Beijing (CN); Wenqu Liu, Beijing (CN); Liwen Dong, Beijing (CN); Xiaoxin Song, Beijing (CN); Detian Meng, Beijing (CN); Libo Wang, Beijing (CN); Dongfei Hou, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 390 days.

(21) Appl. No.: 17/432,433

(22) PCT Filed: Feb. 23, 2021

(86) PCT No.: PCT/CN2021/077506
§ 371 (c)(1),
(2) Date: Aug. 19, 2021

(87) PCT Pub. No.: WO2021/196919
PCT Pub. Date: Oct. 7, 2021

(65) Prior Publication Data
US 2023/0157176 A1  May 18, 2023

(30) Foreign Application Priority Data

Mar. 30, 2020 (CN) .......................... 202010239112.8

(51) Int. Cl.
*H10N 30/20* (2023.01)
*H10K 59/12* (2023.01)
(Continued)

(52) U.S. Cl.
CPC ......... *H10N 30/20* (2023.02); *H10K 59/1201* (2023.02); *H10K 59/122* (2023.02); *H10K 59/873* (2023.02); *H10K 71/00* (2023.02)

(58) Field of Classification Search
CPC .... H10N 30/20; H10N 30/206; H10N 30/853; H10N 30/857; H10N 30/073;
(Continued)

(56) References Cited

U.S. PATENT DOCUMENTS 10,838,241 B1   11/2020  Zhou
2010/0084661 A1*  4/2010  Hwang ............... H01L 27/1288
                                                257/E21.414
(Continued)

FOREIGN PATENT DOCUMENTS

CN   109068245 A   12/2018
CN   109909140 A   6/2019
(Continued)

*Primary Examiner* — Thanh T Nguyen
(74) *Attorney, Agent, or Firm* — IPro, PLLC

(57) ABSTRACT

The disclosure provides a displaying substrate, a manufacturing method thereof, and a display panel, and relates to the technical field of display. The displaying substrate comprises a first supporting base (1), plurality of vibrating element modules (2), and a display module (3). The display module (3) comprises display units (31), connecting units (32) and hollowed-out units (33). Each connecting unit (32) is located between two adjacent display units (31). Each hollowed-out unit (33) is located between two adjacent display units (31) except an area where the corresponding connecting unit (32) is located. The hollowed-out units (33) are provided with cavities (40) corresponding to the vibrating element modules (2). Orthographic projections of the hollowed-out units (33) on a reference plane cover orthographic projections of the
(Continued)

vibrating element modules (2) on the reference plane. The vibrating element modules (2) and the cavities (40) form a transducer.

20 Claims, 3 Drawing Sheets

(51) Int. Cl.
*H10K 59/122* (2023.01)
*H10K 59/80* (2023.01)
*H10K 71/00* (2023.01)

(58) Field of Classification Search
CPC ............. H10K 59/1201; H10K 59/122; H10K 59/873; H10K 71/00; H10K 59/17; H10K 59/00; H10K 59/12; H01L 27/1255
See application file for complete search history.

(56) References Cited

U.S. PATENT DOCUMENTS

| | | | |
|---|---|---|---|
| 2016/0031700 A1 | 2/2016 | Sparks et al. | |
| 2019/0341435 A1* | 11/2019 | Chang | H10K 59/122 |
| 2020/0171540 A1* | 6/2020 | Han | H04R 19/013 |
| 2020/0220513 A1* | 7/2020 | Vetury | H03H 9/105 |

FOREIGN PATENT DOCUMENTS

| | | |
|---|---|---|
| CN | 110112284 A | 8/2019 |
| CN | 110267182 A | 9/2019 |
| CN | 111430412 A | 7/2020 |

* cited by examiner

DISPLAYING SUBSTRATE, MANUFACTURING METHOD THEREOF, AND DISPLAY PANEL

The disclosure claims priority to Chinese Patent Application No. 202010239112.8, entitled "DISPLAYING SUBSTRATE, MANUFACTURING METHOD THEREOF, AND DISPLAY PANEL", filed with the China National Intellectual Property Administration on Mar. 30, 2020, which is incorporated herein by reference in its entirety.

TECHNICAL FIELD

The disclosure relates to the technical field of display, in particular to a displaying substrate, a manufacturing method thereof, and a display panel.

BACKGROUND

Existing displaying devices output sounds by means of an independent sound device (such as a speaker).

SUMMARY

The embodiments of the disclosure provide a displaying substrate, a manufacturing method thereof, and a display panel.

The embodiments of the disclosure adopt the following technical solution:

In one aspect, the disclosure provides a displaying substrate, comprising: a display area, a first supporting base, plurality of vibrating element modules, and a display module, wherein the plurality of vibrating element modules and the display module are respectively disposed on two opposite sides of the first supporting base.

the display module and the plurality of vibrating element modules are located in the display area;

the display module comprises: a plurality of display units that are disposed in an array, a plurality of connecting units, and a plurality of hollowed-out units;

each display unit comprises at least one sub-pixel; each connecting unit is located between two adjacent display units and connects to the two adjacent display units; and each hollowed-out unit is located between two adjacent display units except an area where the corresponding connecting unit is located;

the hollowed-out units are provided with cavities corresponding to the vibrating element modules, and the cavities penetrate through the first supporting base; orthographic projections of the hollowed-out units on a reference plane cover orthographic projections of the vibrating element modules on the reference plane, and the reference plane is parallel to the first supporting base; and the vibrating element modules and the cavities form a transducer, the vibrating element modules are configured to convert electric signals into acoustic signals, and the cavities are configured to propagate the acoustic signals.

Optionally, each vibrating element module comprises: a second supporting base, a first electrode, a piezoelectric layer and a second electrode of the second supporting base are sequentially disposed away from a side of the first supporting base;

the piezoelectric layer is configured to vibrate mechanically under the effect of an electric field to generate ultrasonic waves; and the cavities are configured to propagate the ultrasonic waves.

Optionally, the cavities are disposed in a display side of the first supporting base, a positive electrode is applied to the first electrode, and the second electrode is grounded, so that the piezoelectric layer vibrates towards the display side.

Optionally, the first electrodes in the vibrating element modules are not connected with each other, and the second electrodes in the vibrating element modules are connected with each other.

Optionally, a plurality of connecting electrodes are disposed on a same layer as the second electrodes, and the second electrodes of the vibrating element modules are connected throughout the plurality of connecting electrodes.

Optionally, the first electrode comprises at least one sub-electrode, and the second electrode comprises a planar electrode.

Optionally, the first electrode comprises plurality of said first sub-electrodes that are not connected with each other.

Optionally, the piezoelectric layer is made of an organic piezoelectric material.

Optionally, the displaying substrate further comprising a bonding layer located between the first supporting base and the second supporting base.

Optionally, the displaying substrate further comprising a circuit module and a non-display layer, the circuit module is located in the non-display layer and is configured to input different electric signals to the first electrode and the second electrode.

Optionally, the sub-pixel comprising a source and a drain, and each connecting unit comprising a connecting line, and it is disposed on a same layer as the source and the drain.

Optionally, the sub-pixel further comprising: a first barrier part, a buffer layer, a display area, a gate insulating layer, a gate and an interlayer dielectric layer are sequentially disposed between the source and the drain.

Optionally, the connecting unit further comprising: a second barrier part and a first organic layer are sequentially disposed between the connecting line and the first supporting base, and the first barrier part and the second barrier part are disposed on a same layer.

Optionally, the sub-pixel further comprising: a pixel defining layer, an emitting layer and a first packaging part are sequentially disposed on a side away from the first supporting base of the source and the drain.

Optionally, the connecting unit further comprising: a second organic layer and a second packaging part are sequentially disposed on a side away from the first supporting base of the connecting line, and the first packaging part and the second packaging part are disposed on a same layer.

Optionally, the emitting unit comprising an anode, an emitting layer and a cathode;

the displaying substrate further comprising a post spacer and a post spacer cover.

In another aspect, the disclosure provides a display panel, comprising: a packaging substrate, the displaying substrate and a bonding unit located between the packaging substrate and the displaying substrate.

In another aspect, the disclosure provides a manufacturing method of the displaying substrate, comprising:

forming a display module on a first supporting base, wherein the display module comprising: the plurality of display units arranged in an array, the plurality of connecting units and the plurality of hollowed-out units;

forming the plurality of vibrating element modules on a second supporting base; and bonding a side away from the vibrating element modules of the second supporting base formed with the plurality of vibrating element modules on a side away from the display module of the first supporting base formed with the display module.

Optionally, forming the plurality of vibrating element modules on a second supporting base comprises:

forming a first electrode layer, wherein the first electrode layer comprises the plurality of first electrodes that are not connected with each other, and each said first electrode comprises at least one first sub-electrode;

forming a piezoelectric layer covering the first electrode layer; and forming a second electrode layer covering the piezoelectric layer, wherein the second electrode layer comprising a plurality of second electrodes and a plurality of connecting electrodes.

Optionally, forming a display module on a first supporting base comprises:

sequentially forming a barrier layer, a buffer layer, a display area, a gate insulating layer, a gate and an interlayer dielectric layer on the first supporting base;

removing the buffer layer, the gate insulating layer and the interlayer dielectric layer located in areas of the connecting units and the hollowed-out units by etching;

removing the first supporting base located in the areas of the hollowed-out units by etching;

filling in the connecting units and the hollowed-out units with an organic material to form a first organic layer;

forming a source-active metal layer, wherein the source-active metal layer comprising sources, drains and connecting lines, the sources and the drains are located in the areas of the display units, and the connecting lines are located in the area of the connecting units;

forming a second organic layer covering the source-drain metal layer;

sequentially forming pixel defining layers and anodes in the areas of the display units;

removing the first organic layer and the second organic layer located in the areas of the hollowed-out units by etching and ashing;

sequentially forming emitting layers and cathodes in the areas of the display units; and forming a packaging layer, wherein the packaging layer comprising first packaging parts in the areas of the display units and second packaging parts in the areas of the connecting units.

The aforesaid description is merely a brief summary of the technical solution of the disclosure. To allow those skilled in the art to gain a better understanding of the technical means of the disclosure so as to implement the disclosure according to the contents in the specification and to make the above and other purposes, features and advantages of the disclosure clearer, specific implementations of the disclosure are given below.

BRIEF DESCRIPTION OF THE DRAWINGS

To more clearly explain the technical solutions of the embodiments of the disclosure or the prior art, drawings used for describing the embodiments of the disclosure or the prior art will be briefly introduced below. Obviously, the drawings in the following description only illustrate some embodiments of the disclosure, and those ordinarily skilled in the art can obtain other drawings according to the following ones without creative labor.

DETAILED DESCRIPTION

The technical solutions of the embodiments of the disclosure will be clearly and completely described below in conjunction with the drawings of the embodiments of the disclosure. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

In the embodiments of the disclosure, terms such as "first" and "second" are used to distinguish identical or similar elements with basically the same function and effect merely for the purposes of clearly describing the technical solutions of the embodiments of the disclosure, and should not be construed as indicating or implying relative importance or implicitly indicating the number of technical features referred to.

In the embodiments of the disclosure, "plurality of" refers to two or more, and "at least one" refers to one or more, unless otherwise specifically defined.

Figure 1:
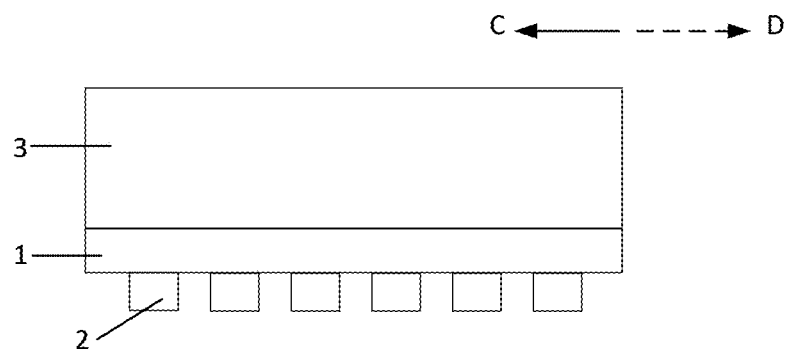
FIG. 1 is a structural diagram of a displaying substrate according to one embodiment of the disclosure.

One embodiment of the disclosure provides a displaying substrate, comprising: a display area (area C in FIG. 1). As shown in FIG. 1, the displaying substrate further comprises: a first supporting base 1, plurality of vibrating element modules 2, and a display module 3, wherein the plurality of vibrating element modules 2 and the display module 3 are disposed on two opposite sides of the first supporting base 1 respectively, and the display module and the vibrating element modules are located in the display area.

Figure 2:
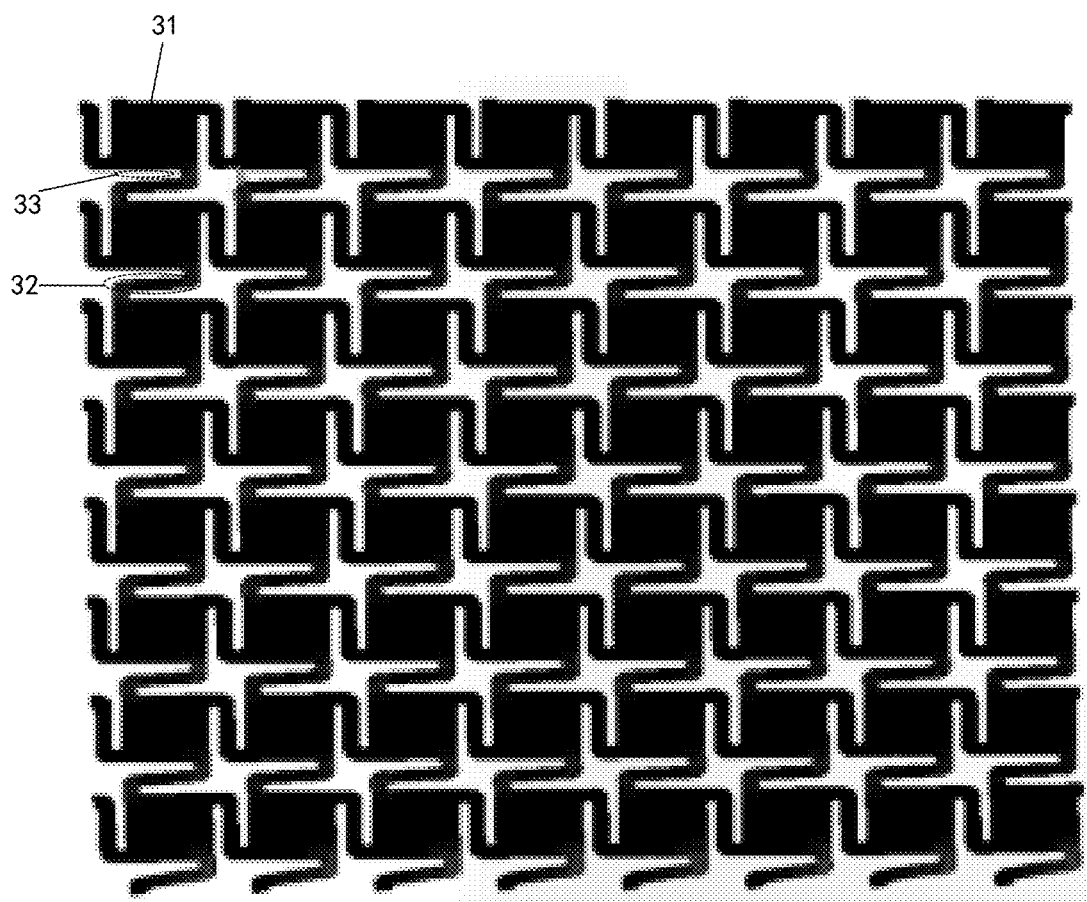
FIG. 2 is another structural diagram of the displaying substrate according to one embodiment of the disclosure.
Figure 3:
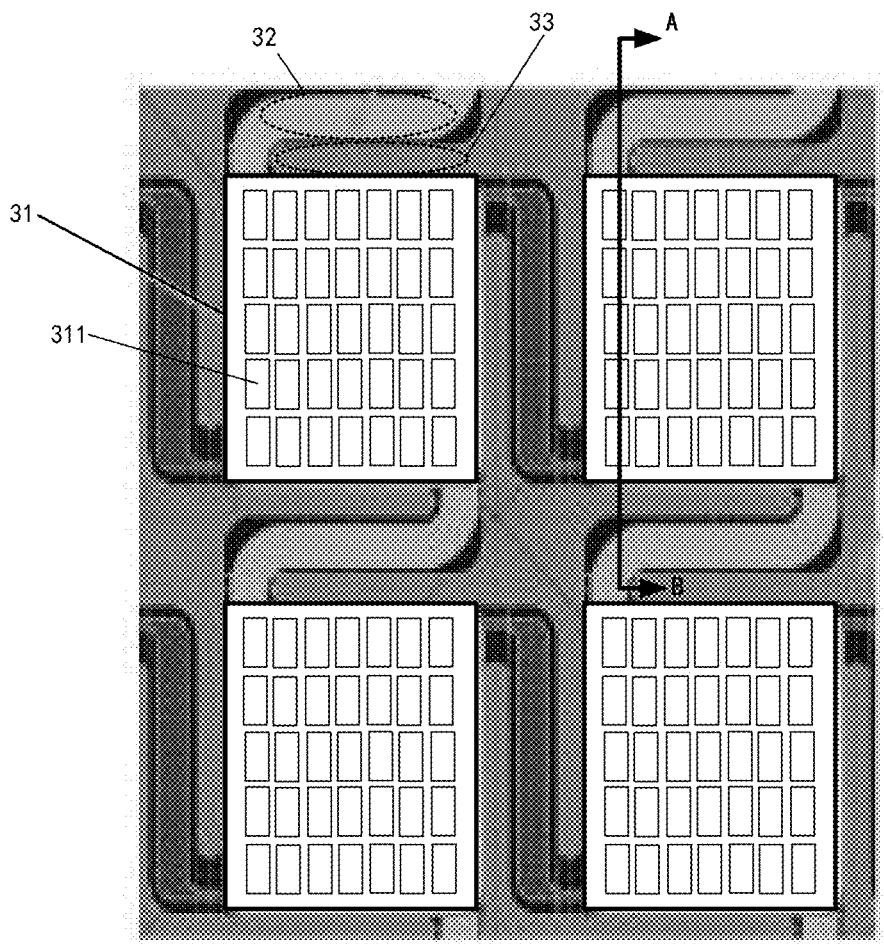
FIG. 3 is a partial enlarged view of FIG. 2.

As shown in FIG. 2 and FIG. 3, the display module comprises: plurality of display units 21 arranged in an array, plurality of connecting units 32 and plurality of hollowed-out units 33. As shown in FIG. 3, each display unit 31 comprises at least one sub-pixel 311, each connecting unit 32 is located between two adjacent display units 31 and connects the two adjacent display units 31, and each hollowed-out unit 33 is located between two adjacent display units 31 except an area where the corresponding connecting unit 32 is located. FIG. 3 is a partial enlarged view of FIG. 2.

Figure 5:
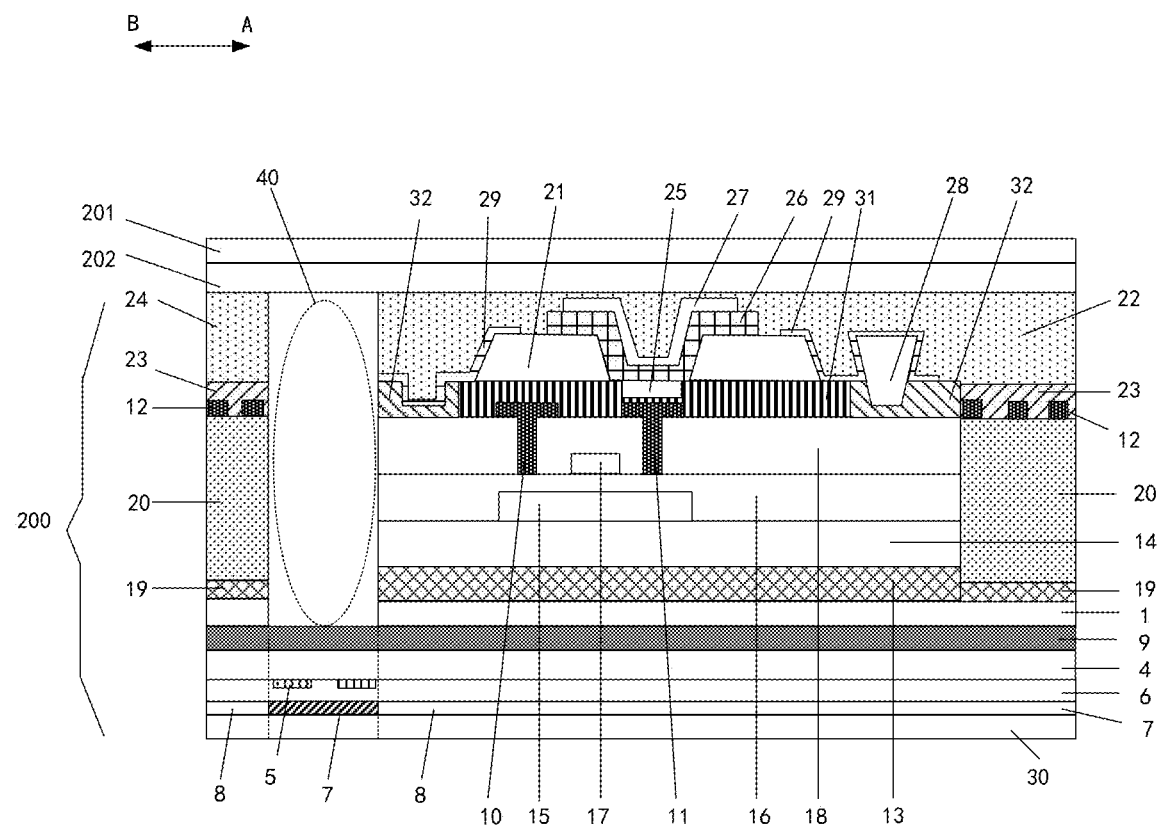
FIG. 5 is another structural diagram of the displaying substrate according to one embodiment of the disclosure.

Referring to FIG. 5, the hollowed-out units are provided with cavities 40 corresponding to the vibrating element modules, and the cavities penetrate through the first supporting base 1; and orthographic projections of the hollowed-out units on a reference plane cover orthographic projections of the vibrating element modules on the reference plane, and the reference plane is parallel to the first supporting base. The vibrating element modules and the cavities form a transducer, the vibrating element modules are configured to convert electric signals into acoustic signals, and the cavities are configured to propagate the acoustic signals. Wherein, one hollowed-out unit may correspond to one vibrating element module, or may correspond to plurality of vibrating element modules as required by the design size.

The displaying substrate comprises the display area, wherein the display area refers to an area for realizing display.

The orthographic projections of the hollowed-out units on the reference plane refer to projections of the hollowed-out units on the reference plane in a direction perpendicular to the reference plane, and the orthographic projections of the vibrating element modules on the reference plane refer to projections of the vibrating element modules on the reference plane in the direction perpendicular to the reference plane.

The number of sub-pixels in each display unit is not limited here. For example, each display unit may comprise one sub-pixel; or, each display unit may comprise plurality of sub-pixels, and in this case, the display unit is of a structure similar to a pixel island. The sub-pixels may be any one of red sub-pixels, green sub-pixels and blue sub-pixels. If each display unit comprises plurality of sub-pixels, the display unit may comprise red sub-pixels, green sub-pixels and blue sub-pixels, or may comprise plurality of sub-pixels in one color, such as plurality of red sub-pixels, plurality of green sub-pixels, or plurality of blue sub-pixels. The specific configuration depends on actual requirements.

The plurality of vibrating element modules and the display modules are disposed on two opposite sides of the first supporting base respectively. For example, if the displaying substrate is applied to a display panel with one display surface, the display module is disposed on a display side of the first supporting base, and the plurality of vibrating element modules are disposed on a non-display side of the first supporting base. In the embodiments and drawings of the disclosure, the display module is disposed on a top side (display side) of the first supporting base and the plurality of vibrating element modules are disposed on a bottom side (non-display side) of the first supporting base, by way of example.

The specific number and arrangement of the connecting units and the hollowed-out units are not limited, and depend on actual circumstances. For example, as shown in FIG. 2, one connecting unit 32 and one hollowed-out unit 33 are disposed between any two adjacent display units 31, and the plurality of connecting units are arranged in an array. Of course, the connecting units and the hollowed-out units may be disposed between part of the display units, and no connecting unit or hollowed-out unit is disposed between the rest of the display units.

The connecting units may comprise plurality of connecting lines for connecting lines of every two adjacent display units, such as data lines and gate signal lines. The sectional shape of the connecting units in a direction parallel to the first supporting base is not limited, and may be a strip shape, a circular shape, a square shape, or the like. In FIG. 2, the sectional shape of the connecting units in the direction parallel to the first supporting base is a strip shape.

The configuration that the cavities in the hollowed-out units penetrate through the first supporting base means that the first supporting base in areas of the hollowed-out units is removed.

The material of the first supporting base is not limited. For example, the material of the first supporting base may be polyimide (PI).

The displaying substrate in this embodiment of the disclosure is integrated with a transducer structure, and a display panel comprising the displaying substrate has a display function and a sound production function, such that a sound device does not need to be arranged separately, and the space is greatly saved, which is beneficial to the further development of the narrow-frame technique. In addition, if the displaying substrate is applied to a display panel with one display surface, the display module is disposed on the display side of the first supporting base, and the plurality of vibrating element modules are disposed on the non-display side of the first supporting base, such that the plurality of vibrating element modules will not affect the display of the display module, and sounds can be produced by a screen without affecting the display of the screen.

Figure 4:
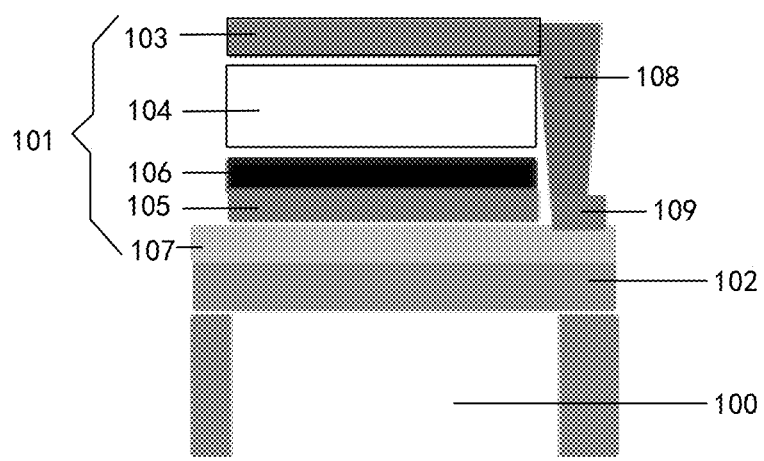
FIG. 4 is a structural diagram of a piezoelectric transducer according to one embodiment of the disclosure.

As shown in FIG. 4, an existing piezoelectric transducer (also referred to as ultrasonic speaker) comprises a glass cavity 100 and a piezoelectric sensor 101 that are bonded together with an optically clear adhesive (OCA) 102. Wherein, the glass cavity is formed by a hard mask process. The piezoelectric sensor 101 comprises a top electrode 103, a piezoelectric material layer 104 and a bottom electrode 105, and is of a three-layer structure similar to a sandwich structure. The piezoelectric transducer is able to amplify acoustic signals into ultrasonic signals to emit ultrasonic waves, the sound pressure of the piezoelectric transducer may reach 110 dB, and the directionality of the piezoelectric transducer is −10°~10°. In FIG. 4, the piezoelectric transducer further comprises silicon nitride (SiN) 106 located between the piezoelectric material layer 104 and the bottom electrode 105, a polyimide (PI) substrate 107, a silver line 108, a drive circuit 109, and the like.

Traditional speakers propagate acoustic waves in all directions, have an approximately spherical sound field, and are poor in directionality of acoustic wave propagation, such that privacy leak and noise pollution may be caused. In this disclosure, the piezoelectric transducer and the displaying substrate are integrated, such that a display panel comprising the displaying substrate may produce sounds highly directionally due to the good penetrability and directionality of ultrasonic waves, and sounds may be propagated highly directionally, thus protecting the privacy and reducing noises.

Optionally, as shown in FIG. 5, each vibrating element module comprises: a second supporting base 4, and a first electrode 5, a piezoelectric layer 6 and a second electrode 7 that are sequentially disposed on a side, away from the first supporting base 1, of the second supporting base 4, wherein the piezoelectric layer is configured to vibrate mechanically under the effect of an electric field to generate ultrasonic waves, and the cavity is configured to propagate the ultrasonic waves.

The material of the piezoelectric layer is not limited here, and may be an organic piezoelectric material (such as polyvinylidene fluoride), or an inorganic piezoelectric material (such as piezoelectric ceramic).

The material of the second supporting base is not limited. For example, the material of the second supporting base may be polyimide (PI).

The material of the first electrode and the material of the second electrode are not limited. For example, the material of the first electrode and the material of the second electrode may be both indium tin oxide (ITO).

The piezoelectric layer has a piezoelectric effect (or piezoelectric property). The piezoelectric effect is a direct piezoelectric effect or an inverse piezoelectric effect. When the piezoelectric material deforms under the effect of an external force, both surfaces of the piezoelectric material will generate electric charges with opposite polarities, and this phenomenon is called the direct piezoelectric effect. On the contrary, when an electric field is applied to the piezoelectric material, the piezoelectric material will vibrate telescopically to deform, and this phenomenon is called the inverse piezoelectric effect.

On the basis of the inverse piezoelectric effect of the piezoelectric layer, when the first electrode and the second electrode receive electric signals, the piezoelectric layer vibrates mechanically under the effect of an electric field to generate ultrasonic waves.

Based on the nonlinear acoustic theory, two columns of planar waves will interact with each other to generate a difference frequency, a sum frequency and second harmonic waves when propagated in an inhomogeneous medium. Two electric signals with the frequencies f1 and f2 are applied to the ultrasonic transducer to produce mechanical vibrations, such that two columns of ultrasonic waves with the frequencies f1 and f2 are generated in air and generate plurality of acoustic waves with frequencies f1, f2, f1+f2, f1−f2, 2f1 and 2f2 in the propagation process under the influence of nonlinear interaction of air. Because the attenuation coefficient α of airborne sounds is in direct proportion to the square of the frequency, ultrasonic waves with high frequencies f1, f2, f1+f2, 2f1 and 2f2 will be quickly absorbed by air to be attenuated with the increase of the propagation distance, and the difference frequency signal with the low frequency f1−f2 continues to be propagated in air. Thus, the difference frequency signal with the frequency f1−f2 is made within an audible acoustic frequency range by reasonably selecting f1 and f2, such that high-directionality audible acoustic waves are generated by means of the high directionality and nonlinear propagation effect of ultrasonic waves.

That is to say, in this embodiment, corresponding electric signals are applied to the first electrode and the second electrode to enable the piezoelectric layer to vibrate to produce mechanical waves and generate ultrasonic waves in the cavity, and the ultrasonic waves are propagated by the cavity to finally emit audible acoustic waves with a required frequency. That is, a device for converting ultrasonic waves into audible acoustic waves does not need to be additionally configured in this embodiment.

It should be noted that the cavity may further change the vibration space and manner of the piezoelectric layer, such that the piezoelectric layer will not vibrate merely in a thickness direction and may vibrate at greater amplitude, such that better sound production effect is realized. As shown in FIG. 5, the cavity 40 is formed in the display side (top side) of the first supporting base 1; if a positive voltage is applied to the first electrode 5 and the second electrode 7 is grounded, the piezoelectric layer 6 will move towards the display side (upwards) under the combined action of the cavity and an electric field, thus further improving the sound production effect and improving user experience.

Optionally, the first electrodes in the vibrating element modules are not connected, and the second electrodes of the vibrating element modules are connected, such that the same electric signal may be input to all the second electrodes, and electric signals may be separately input to the first electrodes, that is, the electric signals of the plurality of first electrodes may be controlled separately. In this way, by inputting different electric signals to the first electrodes of the vibrating element modules, the piezoelectric layers of the different vibrating element modules may have different vibration intensities to generate ultrasonic waves with different frequencies, and finally, sounds at different frequencies are produced.

Optionally, as shown in FIG. 5, the displaying substrate further comprises plurality of connecting electrodes 8 disposed on the same layer as the second electrodes. The second electrodes of the vibrating element modules are connected by means of the plurality of connecting electrodes 8. The connecting electrodes and the second electrodes are made of the same material or different materials. To reduce the manufacturing difficulty, the former is preferred. FIG. 5 is a sectional view along AB in FIG. 3. In FIG. 3, each display unit comprises plurality of sub-pixels. In FIG. 5, only one sub-pixel is shown by way of example. In addition, a packaging substrate and a bonding unit are also shown in FIG. 5.

Optionally, the first electrode comprises at least one first sub-electrode, and the second electrode comprises a planar electrode. The first sub-electrode, a portion, opposite to the first sub-electrode, of the second electrode, and the piezoelectric layer between the first electrode and the second electrode constitute one vibrating element. That is, each vibrating element module comprises at least one vibrating element, and the hollowed-out module corresponding to each vibrating element module corresponds to at least one vibrating element. In FIG. 5, the first electrode comprises two first sub-electrodes by way of example.

Optionally, the first electrode comprises plurality of first sub-electrodes that are not connected with each other. In this way, when the first electrode comprises plurality of first sub-electrodes, different electric signals may be input to the plurality of first sub-electrodes to control the vibration area of the piezoelectric layer, such that the piezoelectric layer is able to emit ultrasonic waves with different frequencies, and sounds with different frequencies are produced, that is, modulation of different sounds may be realized flexibly.

Optionally, the piezoelectric layer is made of an organic piezoelectric material such as polyvinyl fluoride (PVDF). The organic piezoelectric material has a piezoelectric property after being crystallized at a high temperature and polarized in an electric field, such that when the electric field is applied to the surface of the piezoelectric material, the piezoelectric material will telescopically vibrate to generate vibration waves to produce sounds. The transducer formed by the organic piezoelectric layer is also referred to as an organic piezoelectric thin film transducer.

Optionally, as shown in FIG. 5, the displaying substrate further comprises a bonding layer 9 located between the first supporting base 1 and the second supporting base 4. The first supporting base and the second supporting base are bonded together by means of the bonding layer. The bonding layer may be an optically clear adhesive (OCA).

Optionally, the displaying substrate further comprises a circuit module and a non-display area, wherein the non-display area (area D in FIG. 1) is disposed on one side of the display area (area C in FIG. 1), and the circuit module is located in the non-display area and is configured to input different electric signals to the first electrodes and the second electrodes. Optionally, as shown in FIG. 5, the sub-pixel comprises a source 10 and a drain 11, the connecting unit comprises a connecting line 12, and the source 10 and the drain 11 are disposed on the same layer as the connecting line 12.

The source 10 and the drain 11 are disposed on the same layer as the connecting line 12 by a one-step patterning process. The one-step patterning process may form a required layer structure by one-step exposure, and comprises a mask process, an exposure process, a development process, an etching process, a stripping process, and the like.

Optionally, as shown in FIG. 5, the sub-pixel further comprises: a first barrier part 13, a buffer layer 14, a display area 15, a gate insulating layer 16, a gate 17 and an interlayer dielectric layer 18 that are sequentially disposed between the source 10 and the drain 11. The source, the drain, the display area, the gate insulating layer and the gate form a thin-film transistor (TFT). The material of the display area is not limited here. For example, the material of the display area may be an oxide semiconductor material such as indium gallium zinc oxide (IGZO), indium tin zinc oxide (ITZO), or the like.

Referring to FIG. 5, the connecting unit further comprises: a second barrier part 10 and a first organic layer 20 that are sequentially disposed between the connecting line 12 and the first supporting base 1, and the first barrier part 8 and the second barrier part 19 are disposed on the same layer.

The displaying substrate may be used to form an LCD display panel or an organic light-emitting diode (OLED) display panel.

Optionally, if the displaying substrate is used to form an OLED display panel, the sub-pixel further comprises: a pixel defining layer (PDL) 21, an emitting unit and a first packaging part 22 that are sequentially disposed on a side, away from the first supporting base 1, of the source 10 and the drain 11.

The connecting unit further comprises: a second organic packaging layer 23 and a second packaging part 24 that are sequentially disposed on a side, away from the first supporting base 1, of the connecting line 12, and the first packaging part 22 and the second packaging part 24 are disposed on the same layer.

Optionally, as shown in FIG. 5, the emitting unit comprises an anode 25, an emitting layer (EL) 26 and a cathode 27. The displaying substrate may be used to form an organic light-emitting diode (OLED) display panel. Of course, the displaying substrate may further comprise a post spacer (PS) 28 and a PS Cover 29.

One embodiment of the disclosure provides a display panel. As shown in FIG. 5, the display panel comprises a packaging substrate 201, the displaying substrate 200, and a bonding unit 202 located between the packaging substrate 201 and the displaying substrate 200.

The packaging substrate and the displaying substrate are fixed together by means of the bonding unit. The bonding unit may be made of OCA. The packaging substrate may be a glass cover (CG).

The display panel may be a rigid display panel or a flexible display panel (bendable and foldable), and may be an LCD display panel of a twisted nematic (TN) type, a vertical alignment (AV) type, an in-plane switching (IPS) type, or an advanced super dimension switch (ADS) type, or an organic light-emitting diode (OLED) display panel, or any products or components comprising the display panel and having a display function, such as televisions, digital cameras, mobile phones and tablet personal computers.

The displaying substrate of the display panel is integrated with a transducer structure, thus having both a display function and a sound production function; and the sound production function and the screen display function are combined and integrated, such that the process for separately machining a display part and a speaker of traditional displaying devices is avoided, that is, a sound device does not need to be arranged separately, thus, greatly saving the space and facilitating the further development of the narrow-frame technique.

One embodiment of the disclosure provides a manufacturing method of the displaying substrate in the above embodiment. The manufacturing method comprises:

S01: forming a display module on a first supporting base, wherein the display module comprises plurality of display units that are arranged in an array, plurality of connecting units, and plurality of hollowed-out units.

The material of the first supporting base is not limited. For example, the material of the first supporting base may be PI.

S02: forming plurality of vibrating element modules on a second supporting base.

The material of the second supporting base is not limited. For example, the material of the second supporting base may be PI.

S03: bonding a side, away from the vibrating element modules, of the second supporting base formed with the plurality of vibrating element modules on a side, away from the display module, of the first supporting base formed with the display module.

According to the manufacturing method of a displaying substrate in this embodiment of the invention, the displaying substrate formed by the manufacturing method is integrated with a transducer structure, and a display panel comprising the displaying substrate has both a display function and a sound production function, such that a sound production device does not need to be arranged separately, and the space is greatly saved, which is beneficial to the further development of the narrow-frame technique. The manufacturing method is simple, easy to implement, and high in operability.

Optionally, S02: forming plurality of vibrating element modules on a second supporting base comprises:

S021: forming a first electrode layer, wherein the first electrode layer comprises plurality of first electrodes that are not connected with each other, and each first electrode comprises at least one first sub-electrode;

S022: forming a piezoelectric layer covering the first electrode layer; and

S023: forming a second electrode layer covering the piezoelectric layer, wherein the second electrode layer comprises plurality of second electrodes and plurality of connecting electrodes.

Optionally, S01: forming a display module on a first supporting base comprises:

S101: sequentially forming a barrier layer, a buffer layer, a display area, a gate insulating layer, a gate and an interlayer dielectric layer on the first supporting base;

S102: removing, by etching, the buffer layer, the gate insulating layer and the interlayer dielectric layer located in areas of the connecting units and the hollowed-out units;

S103: removing, by etching, the first supporting base located in the areas of the hollowed-out units;

S104: filling in the connecting units and the hollowed-out units with an organic material to form a first organic layer;

S105: forming a source-drain metal layer, wherein the source-drain metal layer comprises sources, drains and connecting lines, the sources and the drains are located in areas of the display units, and the connecting lines are located in the areas of the connecting units;

S106: forming a second organic layer covering the source-drain metal layer;

S107: sequentially forming pixel defining layers and anodes in the areas of the display units;

S108: removing, by lithography and ashing, the first organic layer and the second organic layer located in the areas of the hollowed-out units;

S109: sequentially forming emitting layers and cathodes in the areas of the display units; and S110: forming packaging layer, wherein the packaging layer comprises first packaging parts located in the areas of the display units and second packaging parts located in the areas of the connecting units.

The structures of relevant film layers in the displaying substrate may be understood with reference to the above embodiment, and will no longer be detailed here.

The manufacturing method for manufacturing the displaying substrate, shown in FIG. 5, will be described below by way of example.

S01: forming a display module on a first supporting base specifically comprises:

S201: depositing a PI film (used as the first supporting base), a barrier layer and a buffer layer on a whole surface of a glass substrate (Glass) at a time;

S202: depositing a display area by plasma enhanced chemical vapor deposition (PECVD), and performing patterning by lithography and etching;

S203: depositing a gate insulating layer (GI layer) by PECVD;

S204: depositing a gate (gate layer) by sputter, and performing patterning by lithography and etching;

S205: depositing an interlayer dielectric layer (ILD layer) by a PECVD device;

S206: removing, by etching, the ILD layer, the GI layer and the buffer layer located in the areas of the connecting units and the hollowed-out units;

S207: patterning the ILD layer to form two via holes to realize electrical connection of a source and a drain to a display area;

S208: removing, by etching, the PI film located in the areas of the hollowed-out units;

S209: filling deep holes of the connecting units and the hollowed-out units with an organic material, and performing patterning to form a first organic layer (PLN1 layer);

S210: depositing a source-drain metal layer (SD layer) by sputter, and performing patterning by lithography and etching, wherein the SD layer comprises sources, drains and connecting lines, the sources and the drains are located in the areas of the display units, and the connecting lines are located in the areas of the connecting units;

S211: forming, by coating, a second organic layer (PLN2 layer) with an organic material, and performing patterning by lithography and etching, wherein the PLN2 layer is disposed in the connecting units;

S212: depositing SD Covers (marked as 32 in FIG. 5) by PECVD, and performing patterning, wherein the SD Covers are used for configure post spacers (PS) later;

S213: preparing a third organic layer (PLN3 layer, marked as 31 in FIG. 5), and performing patterning by lithography and etching, wherein the PLN3 layer is disposed in the display units, located between the adjacent SD Covers, and covers the sources and the drains;

S214: depositing anodes (AND layer) by sputter, and performing patterning by lithography and etching;

S215: sequentially forming pixel defining layers (PDL layers) and the post spacers (PSs), and performing patterning by lithography and etching, wherein the PSs are of an inverted-T type;

S216: depositing a PS Cover layer by PECVD;

S217: removing, by lithography and ashing, the PLN1 layer, the PLN2 layer and the PS Cover layer located in the areas of the hollowed-out units;

S218: removing, by lithography and ashing, the PS Cover layer located on the anodes;

S219: forming emitting layers (EL layers) by vapor deposition, and preparing cathodes;

S220: preparing a TFE packaging layer by a packaging device, and performing patterning, wherein the packaging layer comprises first packaging parts located in the areas of the display units and second packaging parts located in the areas of the connecting units; and S221: stripping the Glass and the PI film by LLO.

The displaying substrate comprising the display module is manufactured through the above steps.

S02: forming plurality of vibrating element modules on a second supporting base specifically comprises:

S301: coating a glass substrate (Glass) with a transparent PI film (used as a second supporting base)

S302: depositing, by sputter, an ITO metal (first electrode layer) on the PI film, and then performing patterning by lithography and etching;

S303: forming, by coating, a PVDF film (used as a piezoelectric layer), curing at a certain temperature for a certain time to remove a solvent in a solution, then performing crystallization at a high temperature to generate more B phases, and finally, performing polarization under an electric field to realize a piezoelectric property, wherein the more the B phases, the better the final piezoelectric property;

S304: depositing, by a low-temperature sputter process, second electrodes on the PVDF film;

S305: preparing an insulating layer (marked as 30 in FIG. 5) on the second electrodes to protect the second electrodes; and S306: separating the PI film from the Glass by LLO to form the thin film transducer Sensor shown in FIG. 5.

The second supporting base comprising plurality of vibrating element modules is manufactured through the above steps.

A side, away from the vibrating element modules, of the second supporting base formed with the plurality of vibrating element modules is bonded on a side, away from the display module, of the first supporting base formed with the display module, such that the displaying substrate shown in FIG. 5 is finally formed. After that, a complete displaying substrate is formed by circuit bonding and assembling. Then, the displaying substrate is bonded with a packaging substrate to form a final display panel. The display panel is an OLED display panel.

The above description merely illustrates specific implementations of the disclosure, and the protection scope of the disclosure is not limited to the above description. All variations or substitutions easily obtained by any skilled in the art within the technical scope of the disclosure should fall within the protection scope of the disclosure. Thus, the protection scope of the disclosure should be subject to the protection scope of the claims.

The invention claimed is:

1. A displaying substrate, wherein the displaying substrate is provided with a display area,
the display substrate comprises a first supporting base, a plurality of vibrating element modules and a display module, wherein the plurality of vibrating element modules and the display module are respectively disposed on two opposite sides of the first supporting base;
the display module and the plurality of vibrating element modules are located in the display area;
the display module comprises: a plurality of display units that are disposed in an array, a plurality of connecting units, and a plurality of hollowed-out units;
each display unit comprises at least one sub-pixel; each connecting unit is located between two adjacent display units and connects to the two adjacent display units;

and each hollowed-out unit is located between two adjacent display units except an area where the corresponding connecting unit is located;

the hollowed-out units are provided with cavities corresponding to the vibrating element modules, and the cavities penetrate through the first supporting base; orthographic projections of the hollowed-out units on a reference plane cover orthographic projections of the vibrating element modules on the reference plane, and the reference plane is parallel to the first supporting base; and the vibrating element modules and the cavities form a transducer, the vibrating element modules are configured to convert electric signals into acoustic signals, and the cavities are configured to propagate the acoustic signals.

2. The displaying substrate according to claim 1, wherein each vibrating element module comprises: a second supporting base, a first electrode, a piezoelectric layer and a second electrode of the second supporting base are sequentially disposed away from a side of the first supporting base;

the piezoelectric layer is configured to vibrate mechanically under the effect of an electric field to generate ultrasonic waves; and the cavities are configured to propagate the ultrasonic waves.

3. The displaying substrate according to claim 2, wherein the cavities are disposed in a display side of the first supporting base, a positive electrode is applied to the first electrode, and the second electrode is grounded, so that the piezoelectric layer vibrates towards the display side.

4. The displaying substrate according to claim 2, wherein the first electrodes in the vibrating element modules are not connected with each other, and the second electrodes in the vibrating element modules are connected with each other.

5. The displaying substrate according to claim 4, further comprising a plurality of connecting electrodes are disposed on a same layer as the second electrodes, and the second electrodes of the vibrating element modules are connected throughout the plurality of connecting electrodes.

6. The displaying substrate according to claim 2, wherein the first electrode comprises at least one sub-electrode, and the second electrode comprises a planar electrode.

7. The displaying substrate according to claim 6, wherein the first electrode comprises plurality of said first sub-electrodes that are not connected with each other.

8. The displaying substrate according to claim 2, wherein the piezoelectric layer is made of an organic piezoelectric material.

9. The displaying substrate according to claim 2, wherein the displaying substrate further comprising a bonding layer located between the first supporting base and the second supporting base.

10. The displaying substrate according to claim 2, wherein the displaying substrate further comprising a circuit module and a non-display area, the circuit module is located in the non-display area and is configured to input different electric signals to the first electrode and the second electrode.

11. The displaying substrate according to claim 1, wherein the sub-pixel comprising a source and a drain, and each connecting unit comprising a connecting line, and it is disposed on a same layer as the source and the drain.

12. The displaying substrate according to claim 11, wherein the sub-pixel further comprising: a first barrier part, a buffer layer, a display area, a gate insulating layer, a gate and an interlayer dielectric layer are sequentially disposed between the source and the drain.

13. The displaying substrate according to claim 12, wherein the connecting unit further comprising: a second barrier part and a first organic layer are sequentially disposed between the connecting line and the first supporting base, and the first barrier part and the second barrier part are disposed on a same layer.

14. The displaying substrate according to claim 11, wherein the sub-pixel further comprising: a pixel defining layer, an emitting layer and a first packaging part are sequentially disposed on a side away from the first supporting base of the source and the drain.

15. The displaying substrate according to claim 14, wherein the connecting unit further comprising: a second organic layer and a second packaging part are sequentially disposed on a side away from the first supporting base of the connecting line, and the first packaging part and the second packaging part are disposed on a same layer.

16. The displaying substrate according to claim 14, wherein the emitting unit comprising an anode, an emitting layer and a cathode;

the displaying substrate further comprising a post spacer and a post spacer cover.

17. A display panel, wherein the display panel comprising: a packaging substrate, the displaying substrate according to claim 1, and a bonding unit located between the packaging substrate and the displaying substrate.

18. A manufacturing method of the displaying substrate according to claim 1, comprising:

forming a display module on a first supporting base, wherein the display module comprising: the plurality of display units arranged in an array, the plurality of connecting units and the plurality of hollowed-out units;

forming the plurality of vibrating element modules on a second supporting base; and bonding a side away from the vibrating element modules of the second supporting base formed with the plurality of vibrating element modules on a side away from the display module of the first supporting base formed with the display module.

19. The manufacturing method according to claim 18, wherein forming the plurality of vibrating element modules on a second supporting base comprises:

forming a first electrode layer, wherein the first electrode layer comprises the plurality of first electrodes that are not connected with each other, and each said first electrode comprises at least one first sub-electrode;

forming a piezoelectric layer covering the first electrode layer; and forming a second electrode layer covering the piezoelectric layer, wherein the second electrode layer comprising a plurality of second electrodes and a plurality of connecting electrodes.

20. The manufacturing method according to claim 18, wherein forming a display module on a first supporting base comprises:

sequentially forming a barrier layer, a buffer layer, a display area, a gate insulating layer, a gate and an interlayer dielectric layer on the first supporting base;

removing the buffer layer, the gate insulating layer and the interlayer dielectric layer located in areas of the connecting units and the hollowed-out units by etching;

removing the first supporting base located in the areas of the hollowed-out units by etching;

filling in the connecting units and the hollowed-out units with an organic material to form a first organic layer;

forming a source-active metal layer, wherein the source-active metal layer comprising sources, drains and connecting lines, the sources and the drains are located in the areas of the display units, and the connecting lines are located in the area of the connecting units;

forming a second organic layer covering the source-drain metal layer;

sequentially forming pixel defining layers and anodes in the areas of the display units;

removing the first organic layer and the second organic layer located in the areas of the hollowed-out units by etching and ashing;

sequentially forming emitting layers and cathodes in the areas of the display units; and forming a packaging layer, wherein the packaging layer comprising first packaging parts in the areas of the display units and second packaging parts in the areas of the connecting units.

* * * * *